US012051642B2

(12) United States Patent
Ge et al.

(10) Patent No.: US 12,051,642 B2
(45) Date of Patent: Jul. 30, 2024

(54) QFN SEMICONDUCTOR PACKAGE, SEMICONDUCTOR PACKAGE AND LEAD FRAME

(71) Applicant: NXP USA, INC., Austin, TX (US)

(72) Inventors: You Ge, Tianjin (CN); Zhijie Wang, Tianjin (CN); Meng Kong Lye, Shah Alam (MY)

(73) Assignee: NXP USA, Inc., Austin, TX (US)

( * ) Notice: Subject to any disclaimer, the term of this patent is extended or adjusted under 35 U.S.C. 154(b) by 364 days.

(21) Appl. No.: 17/386,632

(22) Filed: Jul. 28, 2021

(65) Prior Publication Data

US 2022/0077052 A1    Mar. 10, 2022

(30) Foreign Application Priority Data

Sep. 10, 2020   (CN) .......................... 202010946800.8

(51) Int. Cl.
*H01L 23/498* (2006.01)
*H01L 23/31* (2006.01)
*H01L 21/48* (2006.01)
*H01L 21/56* (2006.01)

(52) U.S. Cl.
CPC ...... *H01L 23/49861* (2013.01); *H01L 23/315* (2013.01); *H01L 23/49838* (2013.01); *H01L 21/4839* (2013.01); *H01L 21/565* (2013.01)

(58) Field of Classification Search
CPC ............. H01L 23/49861; H01L 23/315; H01L 23/49838
See application file for complete search history.

(56) References Cited

U.S. PATENT DOCUMENTS

| | | | |
|---|---|---|---|
| 6,204,553 B1 * | 3/2001 | Liu ................... | H01L 23/49503 257/676 |
| 6,638,790 B2 * | 10/2003 | Minamio .............. | H01L 21/566 438/118 |
| 6,777,788 B1 | 8/2004 | Wan et al. | |
| 8,236,612 B2 | 8/2012 | San Antonio et al. | |
| 8,673,687 B1 * | 3/2014 | Liu ................... | H01L 23/49541 257/670 |
| 9,029,991 B2 | 5/2015 | Warren et al. | |
| 9,362,211 B1 * | 6/2016 | Gao .................. | H01L 23/49503 |
| 9,401,318 B2 * | 7/2016 | Shih ................. | H01L 23/49541 |
| 11,398,417 B2 * | 7/2022 | Talledo ................... | H01L 24/32 |

(Continued)

FOREIGN PATENT DOCUMENTS

KR    20170085499 A    7/2017

*Primary Examiner* — Eugene Lee

(57) ABSTRACT

A Quad Flat No-Lead (QFN) package comprises a semiconductor die, a lead frame and molding compound. The lead frame comprises a die pad having a substantially rectangular inner part and a plurality of protrusions around the periphery thereof and contiguous therewith and extending outwardly therefrom, and a plurality of leads around the four sides of the die-pad. The molding compound encapsulates the semiconductor die and forming the package. The molding compound has a respective moat therein between each side of the die pad and a respective set of leads. The die pad has a plurality of trenches extending from the second surface of the die pad towards the first surface at least in the inner part of the die pad. The plurality of the trenches each extend across a protrusion to the moat.

20 Claims, 13 Drawing Sheets

FIG. 4A

(56) References Cited

U.S. PATENT DOCUMENTS

| | | | |
|---|---|---|---|
| 2004/0070056 A1* | 4/2004 | Matsuzawa | H01L 23/49524 257/E23.079 |
| 2008/0258278 A1* | 10/2008 | Ramos | H01L 21/4832 257/676 |
| 2009/0072367 A1* | 3/2009 | Poddar | H01L 24/83 257/676 |
| 2015/0228611 A1* | 8/2015 | Ng | H01L 33/62 257/773 |
| 2018/0190556 A1* | 7/2018 | Male | H01L 27/0288 |
| 2021/0183750 A1* | 6/2021 | Rodriguez | H01L 24/32 |

* cited by examiner (A-A')

(C-C')

(C-C')

(A-A')

(C-C')

QFN SEMICONDUCTOR PACKAGE, SEMICONDUCTOR PACKAGE AND LEAD FRAME

CROSS-REFERENCE TO RELATED APPLICATIONS

This application claims the priority under 35 U.S.C. § 119 of China application no. 202010946800.8, filed on 10 Sep. 2020, the contents of which are incorporated by reference herein.

BACKGROUND

The present invention relates to a semiconductor package, and, more particularly, to a Quad Flat Non-leaded (QFN) semiconductor package and a Quad Flat Package (QFP) and a lead frame for use with the QFN semiconductor package.

There are various kinds of packages available for semiconductor devices. One common package type is known as a QFN package. In this package type, which is lead frame based and with hidden leads. Another common package type is a QFP or Quad Flat Package. In this package type, the leads project from the sides of the package housing. Both QFN and QFP package may have thermal dissipation problems because of the void generated on the backside of the lead frame during the soldering process.

Take the QFN package for example, FIG. 1 shows a sectional view of a generally known QFN package 100. The QFN package 100 includes a die 101, conductive die pad 102, leads 103, bond wires 104 and molding compound 105. As shown in FIG. 1, the die 101 is supported by conductive die pad 102 beneath. There are leads 103 around the die pad 102. During assembly, the die 101 is attached to the die pad 102 and bond wires 104 are used to electrically couple bond pads on each die 101 to their associated leads 103. The bond wires 104 may also be used to electrically couple bond pads on each die 101 to the die pads 102. After the wire bonding, a plastic cap is molded over the top surface of wire bonded dies with the molding compound 105.

FIG. 2 shows the void underneath die pad and leads. In conventional process, many flux voids 201 underneath the die pad 102 and leads 103 may seriously reduce package thermal dissipation performance. Sometimes a big die pad area is used to improve the thermal dissipation. However, due to the big void side-effects, thermal performance is still not good.

Thus, it would be desirable to have a semiconductor package which may improve the package thermal dissipation performance.

SUMMARY

This summary is provided to introduce a selection of concepts in a simplified form that are further described below in the Detailed Description. This summary is not intended to be relied on to identify key features or essential features of the claimed subject matter, nor is it intended to be used to limit the scope of the claimed subject matter.

According to a first aspect, there is provided a Quad Flat No-Lead (QFN) package comprising:
a semiconductor die;
a lead frame having a thickness between a first surface and a second surface, and comprising:
a die pad having a rectangular inner part and a plurality of protrusions around the periphery thereof and contiguous therewith and extending outwardly therefrom, and
a plurality of leads around the four sides of the die-pad, spaced apart therefrom and electrically isolated therefrom, with spaces therebetween; and
molding compound encapsulating the semiconductor die and forming the package, wherein the molding compound fills spaces between the leads and is in spaces separating the die pad from the leads, the molding compound having a respective moat therein between each side of the die pad and a respective set of leads;
wherein the semiconductor die is attached to the first surface of the die pad;
wherein the die pad has a plurality of trenches having a depth which is smaller than the thickness of the lead frame extending from the second surface of the die pad towards the first surface at least in the inner part of the die pad;
wherein a plurality of the trenches each extend across the protrusion to the moat.

According to a second aspect, there is provided a lead frame for use in the manufacture of a QFN package as claimed in claims 1-12, the lead frame having a thickness between a first surface and a second surface and comprising:
a die pad region having a first, rectangular, inner region with a plurality of protrusions around the periphery thereof and contiguous therewith and extending outwardly therefrom,
a channel region outward of each of the four sides of the die pad region,
and a plurality of lead regions around the die pad, and each side of the die pad region spaced apart from a respective set of the lead regions by the channel region;
wherein the lead frame further comprises a plurality of trenches having a depth which is smaller than the thickness of the lead frame extending from the second surface of the die pad region towards the first surface at least in the first inner region of the die pad region;
wherein a plurality of the trenches each extend only partially across a respective protrusion.

According to a third aspect, there is provided a semiconductor package comprising,
a semiconductor die;
a lead frame having a thickness between a first surface and a second surface, and comprising:
a die pad having a generally rectangular inner part and a plurality of protrusions around the periphery thereof and contiguous therewith and extending outwardly therefrom, and
molding compound encapsulating the semiconductor die and forming the package, wherein the molding compound having a respective moat around each side of the die pad;
wherein the semiconductor die is attached to the first surface of the die pad;
wherein the die pad has a plurality of trenches having a depth which is smaller than the thickness of the lead frame extending from the second surface of the die pad towards the first surface at least in the inner part of the die pad;
wherein a plurality of the trenches each extend across the protrusion to the moat.

BRIEF DESCRIPTION OF THE DRAWINGS

So that the manner in which the above recited features of the present application can be understood in detail, a more particular description of the application, briefly summarized above, can be had by reference to embodiments, some of which are illustrated in the appended drawings. It is to be noted, however, that the appended drawings illustrate only typical embodiments of this application and are therefore not to be considered limiting of its scope, for the application can admit to other equally effective embodiments. The drawings are for facilitating an understanding of the application and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
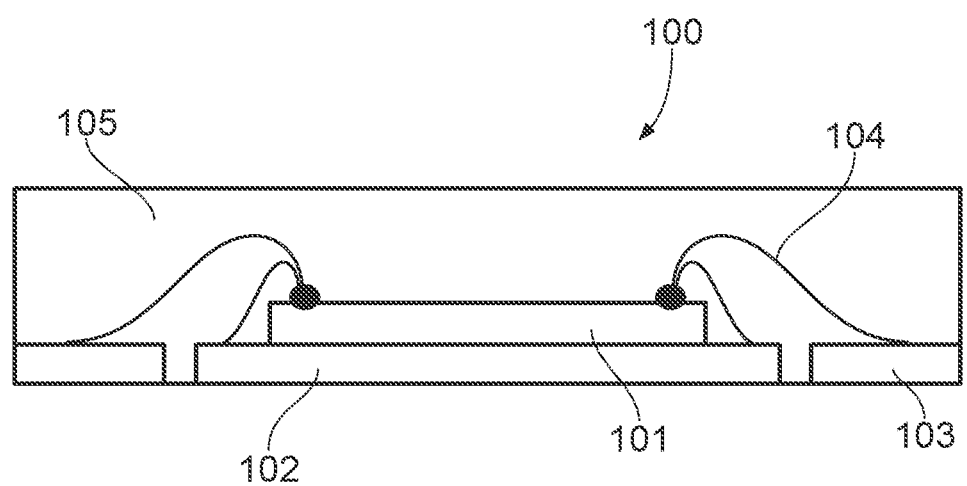
FIG. 1 is a cross-section view of a generally known Structure of a QFN Semiconductor package.
Figure 2:
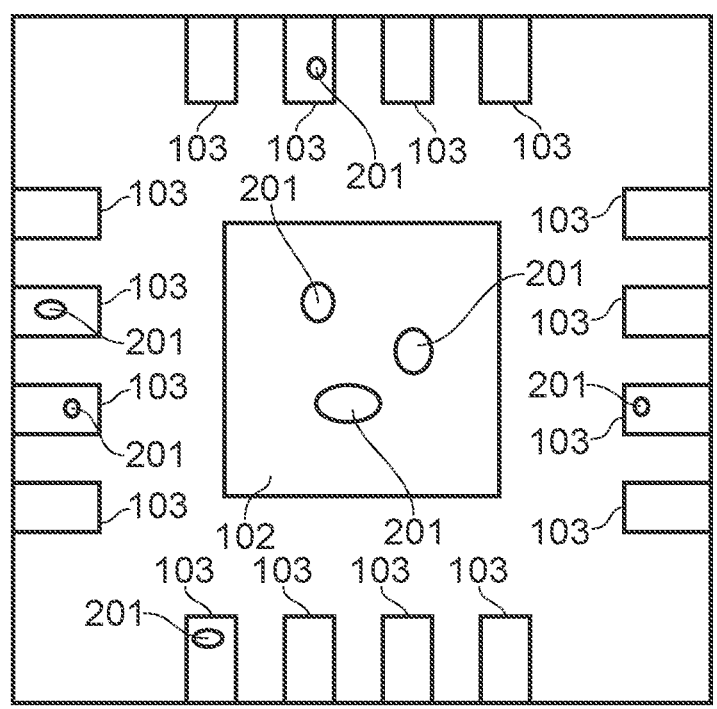
FIG. 2 is a bottom view of the QFN package with the void underneath die pad and leads.
Figure 3A:
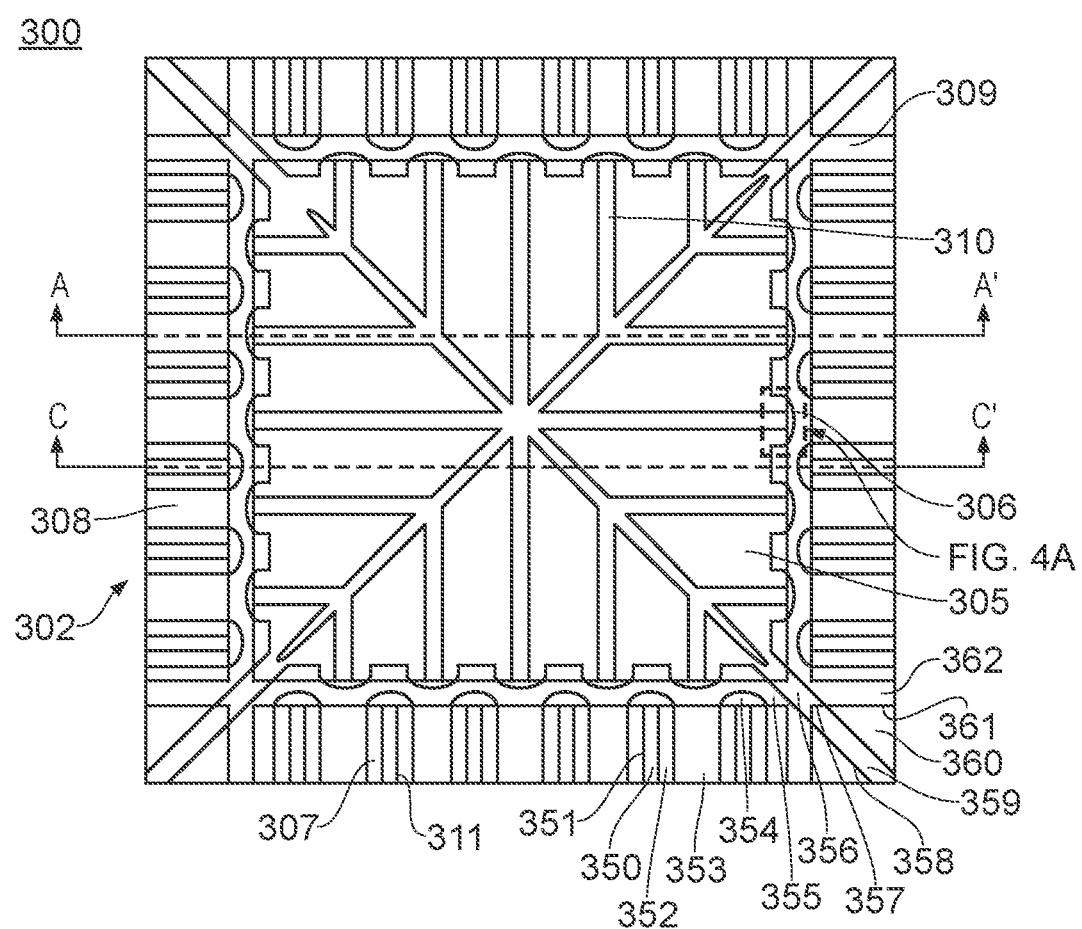
FIG. 3A is a bottom view of a QFN package according to an embodiment of the present invention.
Figure 3B:
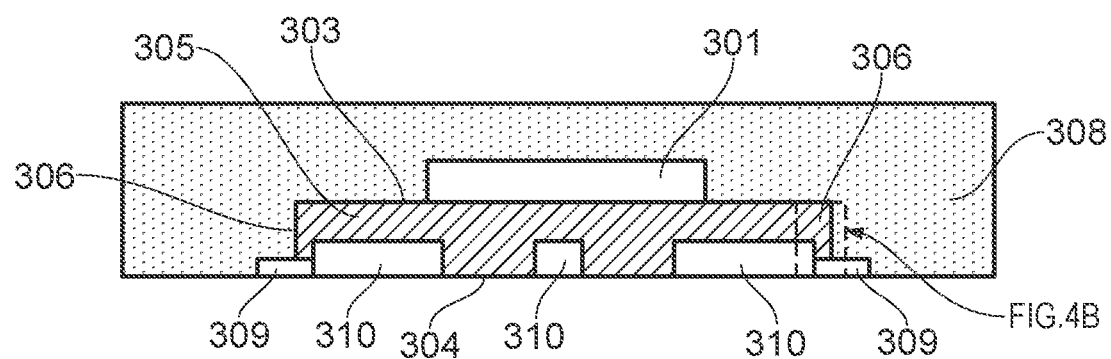
FIG. 3B is a cross-section view of the QFN package of FIG. 3A along line A-A'.
Figure 3C:
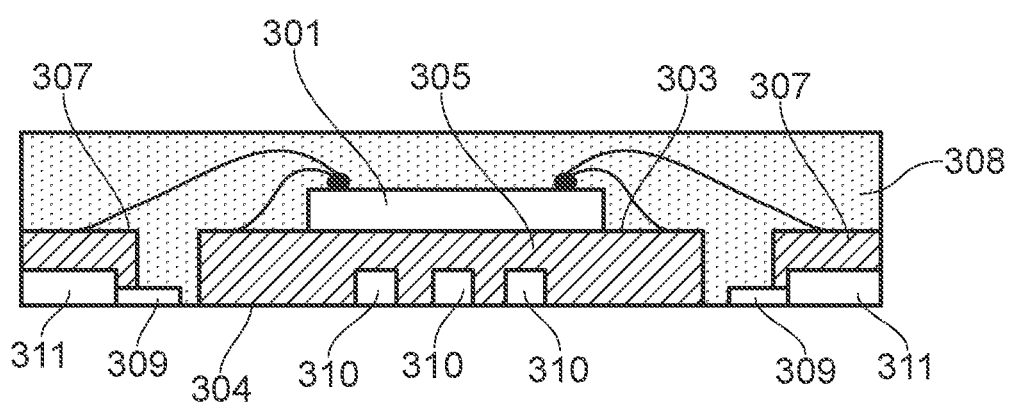
FIG. 3C is a cross-section view of the QFN package of FIG. 3A along line C-C'.
Figure 4A:
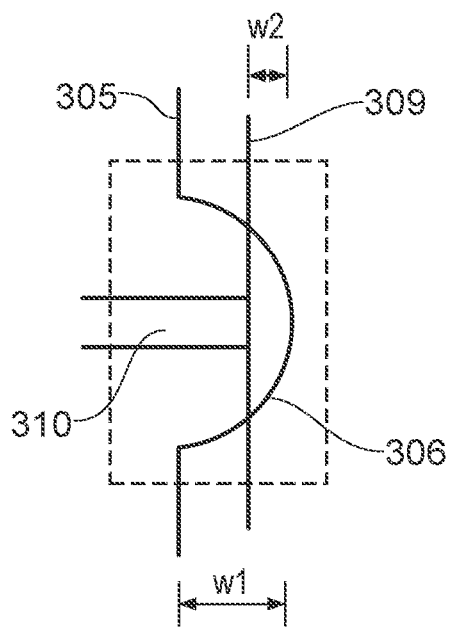
FIG. 4A is a close-up view of the region including protrusion 306 of FIG. 3A.
Figure 4B:
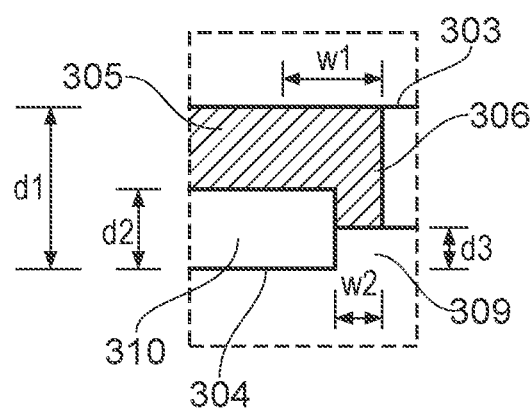
FIG. 4B is a close-up view of the region including protrusion 306 of FIG. 3B.

Referring now to FIG. 3A, FIG. 3B and FIG. 3C, an embodiment of a QFN package according to the present invention is shown. FIG. 3A is a bottom view of a QFN package according to an embodiment of the present invention. FIG. 3B is a cross-section view of the QFN package of FIG. 3A along line A-A', and FIG. 3C is a cross-section view of the QFN package of FIG. 3A along line C-C'. FIG. 4A is a close-up view of the region including protrusion 306 of FIG. 3A, and FIG. 4B is a close-up view of the region including protrusion 306 of FIG. 3B.

The QFN package 300 includes a semiconductor die 301 and a lead frame 302. The lead frame 302 has a thickness between a first surface 303 and a second surface 304. Typically, the lead frame 302 is formed from a sheet of copper and may be partially or fully coated with metals or metal alloys that prevent corrosion or enhance adhesion. The thickness of the lead frame 302 may be about 203 μm.

The lead frame 302 comprises a die pad 305 having a rectangular inner part and a plurality of protrusions 306 around the periphery thereof and contiguous therewith and extending outwardly therefrom, and a plurality of leads 307 around the four sides of the die-pad 305, spaced apart therefrom and electrically isolated therefrom, with spaces therebetween. The die pad 305 and the plurality of leads 307 may have the same thickness as the lead frame 302. The inner part of the die pad 305 may have width dimensions of about 3 mm by 3 mm. In one or more embodiment, the QFN package may have a smaller size die pad than the die pad 305 as shown in FIGS. 3A, 3B and 3C. In the present preferred embodiment, each of the protrusions 306 have circular arc shapes and may be located between the closest points of the die pad 305 to two respective adjacent leads 307 to prevent the die pad 305 from directly contacting the leads 307, which would reduce the risk of short circuit and make the following cutting process easier. In other embodiments, the protrusions 306 may have other shapes, e.g. rectangle.

The QFN package 300 further includes molding compound 308 encapsulating the semiconductor die 301 and forming the QFN package 300. The molding compound 308 fills spaces between the leads 307 and is in spaces separating the die pad 305 from the leads 307. The molding compound 308 has a respective moat 309 therein between each side of the die pad 305 and a respective set of leads 307. In the preferred embodiments, each of the moats 309 may extend to an edge of the package. A preferred depth of the moat produced is no more than half of the thickness of the die pad 301. The depth of the moats 309 may be one fourth of the thickness of the lead frame 302.

The semiconductor die 301 is attached to the first surface 303 of the die pad 305 using conventional die attachment techniques. Thereafter, the semiconductor die 301 may be electrically connected to associated ones of the leads 307 with bond wires 104. The bond wires are typically formed from gold or copper.

According to the present disclosure, the die pad 305 has a plurality of trenches 310 having a depth which is smaller than the thickness of the lead frame 302 extending from the second surface 304 of the die pad 305 towards the first surface 303 at least in the inner part of the die pad 305. In the preferred embodiments, the depth of the trenches 310 is half of the thickness of the lead frame 302. The depth of the trenches may be about 100 μm. The depth of the trenches 310 can be greatly varied. As shown in FIG. 3A, preferably the plurality of trenches 310 may form an interconnected network which may help to prevent voids generated during soldering. FIG. 3A only shows one pattern of the plurality of trenches 310. However, there may be more patterns of the trenches to form an interconnected network on the backside of the die pad 305.

As will be described more detailed in FIGS. 4A and 4B, a plurality of the trenches 310 each extend across the protrusion 306 to the moat 309.

Referring to FIG. 4A and FIG. 4B, the die pad 305 may have a thickness d1 as the lead frame 302. The die pad 305 have a plurality of protrusions 306 which may have a width w1. The die pad 305 has a plurality of trenches 310 with a depth d2 which may be about half of the thickness d1 extending from the second surface 304 of the die pad 305 towards the first surface 303 at least in the inner part of the die pad 305. The moats 309 are located between each side of the die pad 305 and a respective set of leads 307. Part (shown in FIG. 3C as a dashed rectangle) of the moat 309 may overlap with the protrusion 306 to expose the trench 310. The overlapped part may have a width w2 and a depth d3. Thus, a plurality of the trenches 310 each extend across a protrusion 306 to the moat 309.

Referring back to FIG. 3A to 3C, each of the leads 307 has a first end distal from the die pad 305 and a second end proximal to the die pad 305. The first end of the leads 307 are exposed on both a bottom surface and lateral side surfaces of the package to allow external electrical communication to an external circuit. In the present preferred embodiment, each of the second ends proximal to the die pad 305 has a circular arc shape. The leads 307 each are preferred to have a trench 311 which is configured to extend from the second surface towards the first surface and having a depth which is smaller than the thickness of the lead frame. And the trench 311 in each of the leads 307 extends across the circular arc shape of the second end to the moat 309.

FIG. 3A also shows a list of the parts where the labelled surface or edges that are visible. Referring to FIG. 3A, the leads 307 may comprise recessed lead 350 at bottom of trench 311 and edge 351 of trench 311 and the lead 352 at surface of the package. Molding compound 353 are filled between the leads 307. The moat 309 may overlap with the lead 307. The lead metal 354 and molding compound 355 may be exposed at bottom of moat 309. The moat 309 may be formed on main tie bar 359 and recessed main tie bar 356 may be formed on the molding compound 355. The moat 309 may comprise edge 357 of moat and the main tie bar may comprise edge 358. Molding compound 360 may be filled between the moat 309 and the main tie bar 359. The moat 309 may further comprise the edge 361 and molding compound 362 are under the moat 309.

Figure 3D:
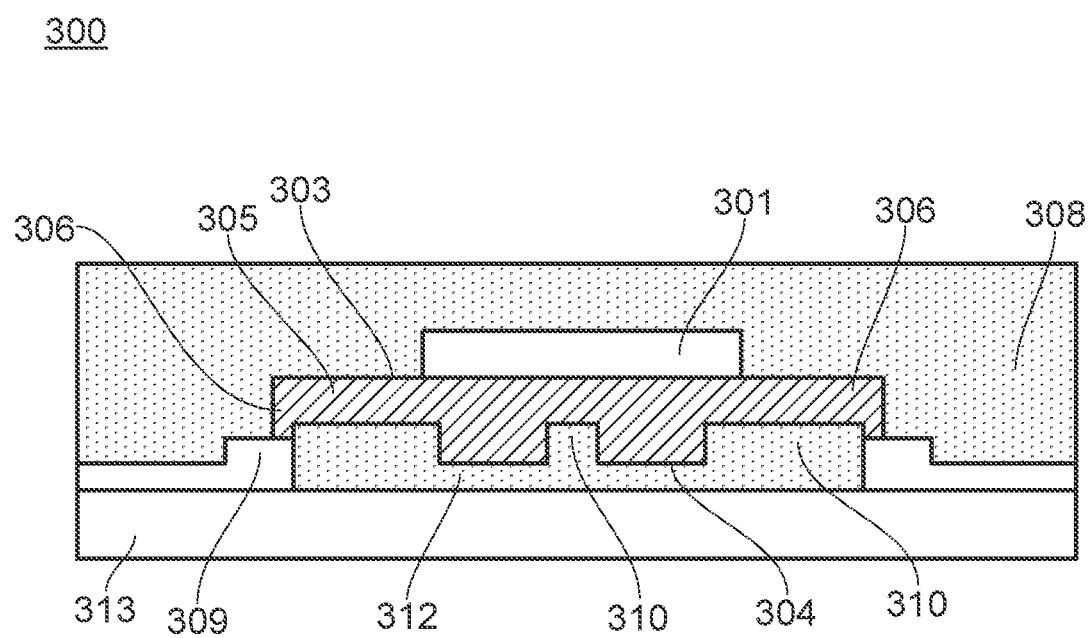
FIG. 3D is an assembly comprising the QFN package of FIG. 3B.
Figure 3E:
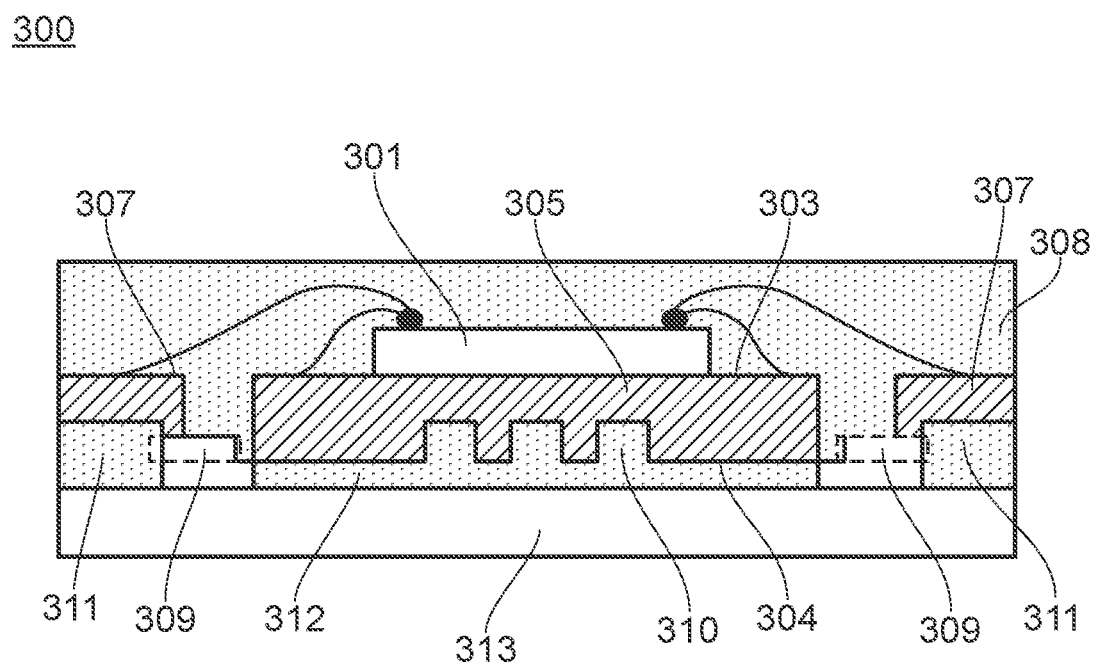
FIG. 3E is an assembly comprising the QFN package of FIG. 3C.

FIG. 3D is an assembly comprising the QFN package of FIG. 3B, and FIG. 3E is an assembly comprising the QFN package of FIG. 3C. Referring to FIG. 3D and FIG. 3E, An assembly comprising the QFN package 300 may further comprise a supplementary solder layer 312 of reflowable material formed on the second surface of the lead frame 302 and the supplementary solder 312 may be formed of a solder material. The trenches 310 may also been filled with the solder material. The supplementary solder layer 312 may enhance electrical conduction properties and facilitate attachment of the die pad 305 to a substrate 313. In one embodiment, the substrate 313 may be a printed circuit board (PCB). The printed circuit board (PCB) may be attached to the bottom surface of the supplementary solder layer 312.

Commonly, the supplementary solder layer 312 is formed to a thickness of about 30-90 µm thick. Typically, such supplementary solder layers may be applied using a screen printing process. Screen printing is a process where a solder paste may be applied to the surface of a substrate through openings in a screen mask. The openings in the screen mask may be patterned to align with the die pad 305 and the leads 307. By applying the solder paste through openings in the screen, the supplementary solder layer 312 is applied to the die pad 305 and the leads 307 of the QFN package 300. The supplementary solder layer 312 may be reflowed prior to attachment to a PCB 313 during the reflow process. Unfortunately, the solder pastes commonly used during screening include significant amounts of flux and epoxy. This may create the soft compound needed during screening, but also creates some problems during reflow of the supplementary solder layer, as the heated flux produces gas, which can result in so-called "flux-voids". The presence of protrusions 306, trenches 307 and moats 309 may provide a path for the unwanted flux voids formed during the solder process to reach the exterior such that no voids remain in the solder.

The semiconductor device of the present invention may not be limited to the QFN package. Regarding the QFN package in accordance with an embodiment of the present invention, the void generated during the soldering process also can exposed by the trenches formed in the leads because the leads located inside the QFN package. However, the semiconductor package may be other type of packages such as QFP package which does not have the leads inside the package.

A semiconductor package is provided as below. The semiconductor package comprises a semiconductor die, a lead frame having a thickness between a first surface and a second surface. The lead frame comprises a die pad having a generally rectangular inner part and a plurality of protrusions around the periphery thereof and contiguous therewith and extending outwardly therefrom. The semiconductor package may further comprise molding compound encapsulating the semiconductor die and forming the package. In one or more embodiments, the protrusions may have circular arc shapes to avoid the risk of short circuit. The molding compound has a respective moat around each side of the die pad. The semiconductor die is attached to the first surface of the die pad. The die pad has a plurality of trenches having a depth which is smaller than the thickness of the lead frame extending from the second surface of the die pad towards the first surface at least in the inner part of the die pad. In one or more embodiment, the plurality of trenches may form an interconnected network. A plurality of the trenches each extends across a respective one of the protrusions to the moat.

Figure 5A:
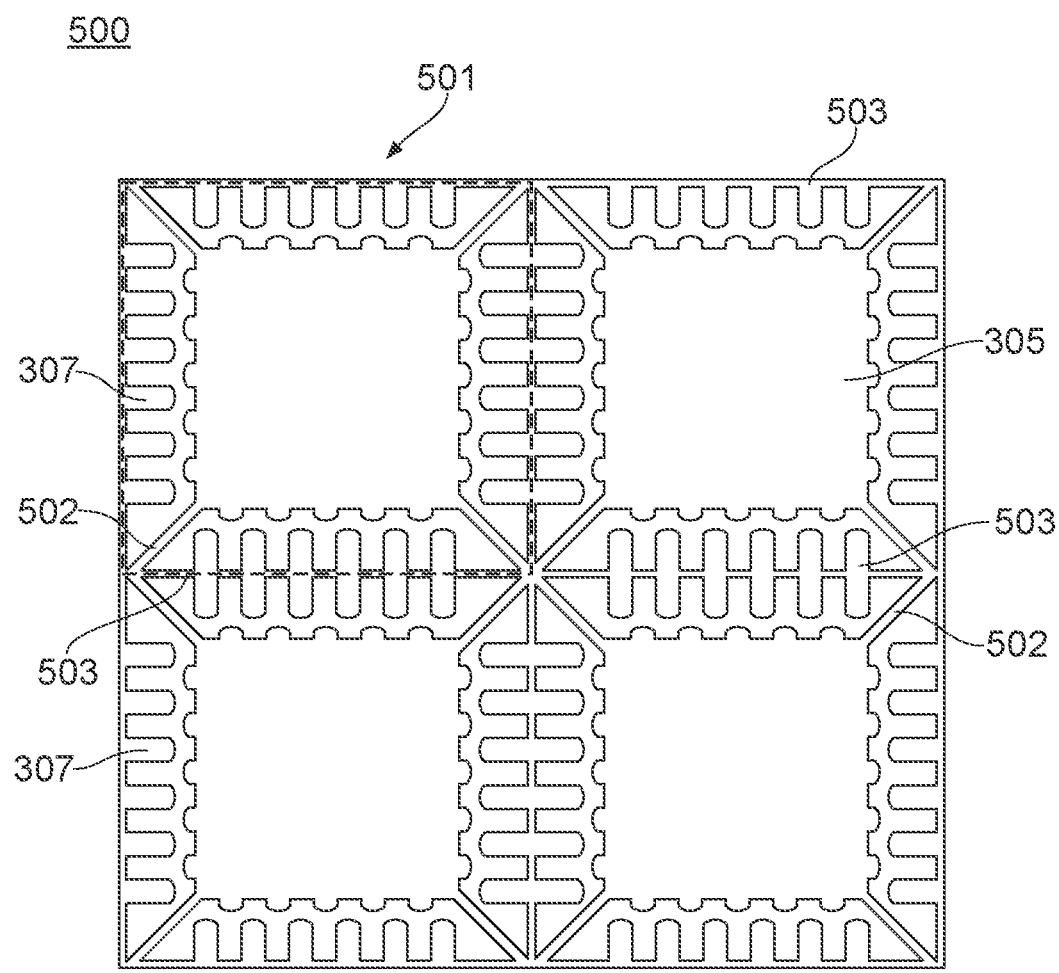
FIG. 5A is a top view of the lead frame for use in the manufacture of a QFN package.
Figure 5B:
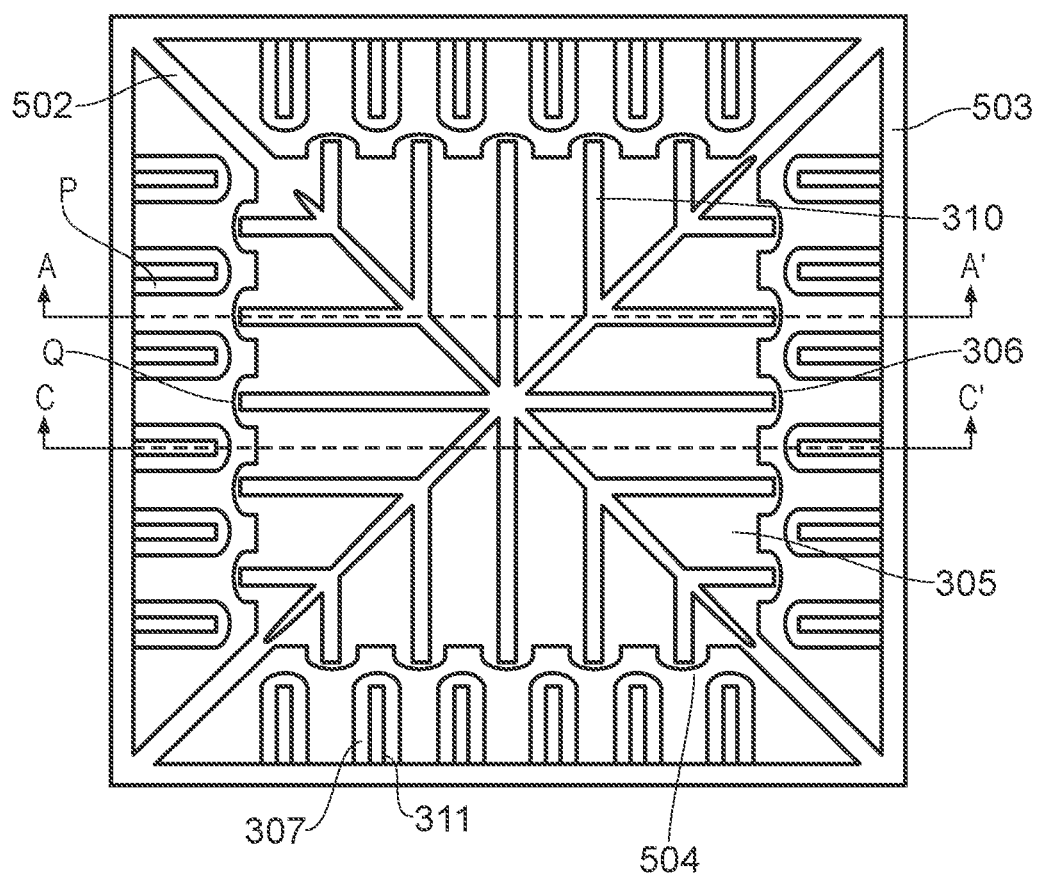
FIG. 5B is an enlarged bottom view of an unit lead frame 501 and FIG. 5C is an enlarged top view of an unit lead frame 501.
Figure 5C:
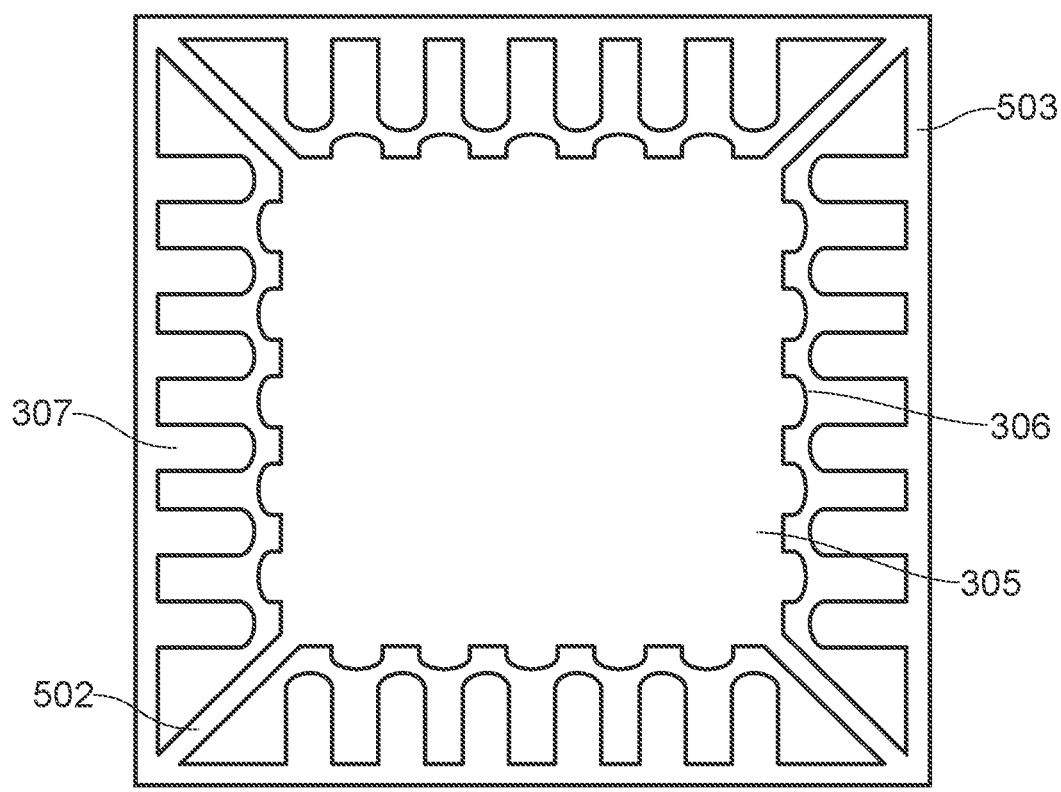
Figure 6A:
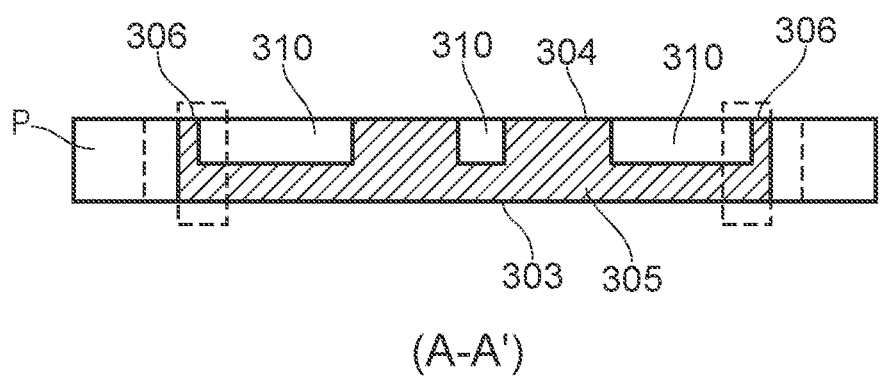
FIG. 6A is a cross-section view of the lead frame of FIG. 5B along line A-A' according to an embodiment of the present invention.
Figure 6B:
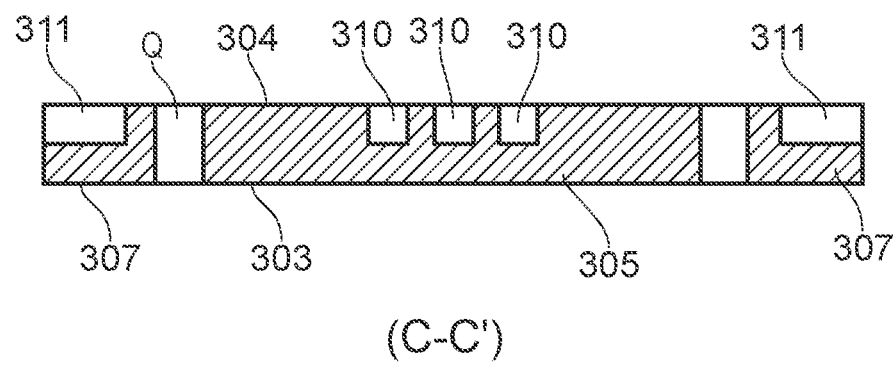
FIG. 6B is a cross-section view of the lead frame of FIG. 5B along line C-C'.

Referring to FIG. 5A, FIG. 5B, FIG. 5C, FIGS. 6A and 6B, an embodiment of a lead frame according to the present invention is shown. FIG. 5A is a top view of a group of lead unit frame for use in the manufacture of QFN packages, FIG. 5B is an enlarged bottom view of a single lead frame 501 and FIG. 5C is an enlarged top view of a lead frame 501. FIG. 6A is a cross-section view of the lead frame of FIG. 5B along line A-A' according to an embodiment of the present invention, and FIG. 6B is a cross-section view of the lead frame of FIG. 5B along line C-C'.

The lead frame 500 consists of several unit lead frames 501. The unit lead frames 501 have the same configuration and may be arranged in a matrix form and supported by main tie bars 502 and cross tie bars 503. The unit lead frames may interconnect with each other through cross tie bars 503. FIG. 5A show a 2×2 matrix of the unit lead frames 501. However, there may be other numbers of unit lead frames and they need not to have equal numbers of rows and columns. They may be provided on a continuous reel.

The differences between the bottom view of the lead frame 501 (see FIG. 5B) and the bottom view of the QFN package 300 (see FIG. 3A) include the following regions. The lead frame 501 has the cross tie bars 503 which are removed in the QFN package 300. Besides, the lead frame 501 has the channel 504 while the QFN package 300 has the moats 309 which are formed by cutting at least on the channel 504. The details of the unit lead frame 501 will be described as below.

The unit lead frame 501 has a thickness between a first surface 303 and a second surface 304. The unit lead frame 501 may comprise a die pad region 305 having a first, substantially rectangular, inner region with a plurality of protrusions 306 around the periphery thereof and contiguous therewith and extending outwardly therefrom, a channel region 504 outward of each of the four sides of the die pad region 305, and a plurality of lead regions 307 around the die pad 305. The main tie bars 502 and the cross tie bars 503 support the die pad region 305 and the lead regions 307. Each side of the die pad region 305 may be spaced apart from a respective set of the lead regions 307 by the channel region 504. The lead frame 501 further comprises a plurality of trenches 310 having a depth which is smaller than the thickness of the lead frame 501 extending from the second surface 304 of the die pad region 305 towards the first surface 303 at least in the first inner region of the die pad region 305. And a plurality of the trenches 310 each extend only partially across a respective protrusion 306.

Figure 7:
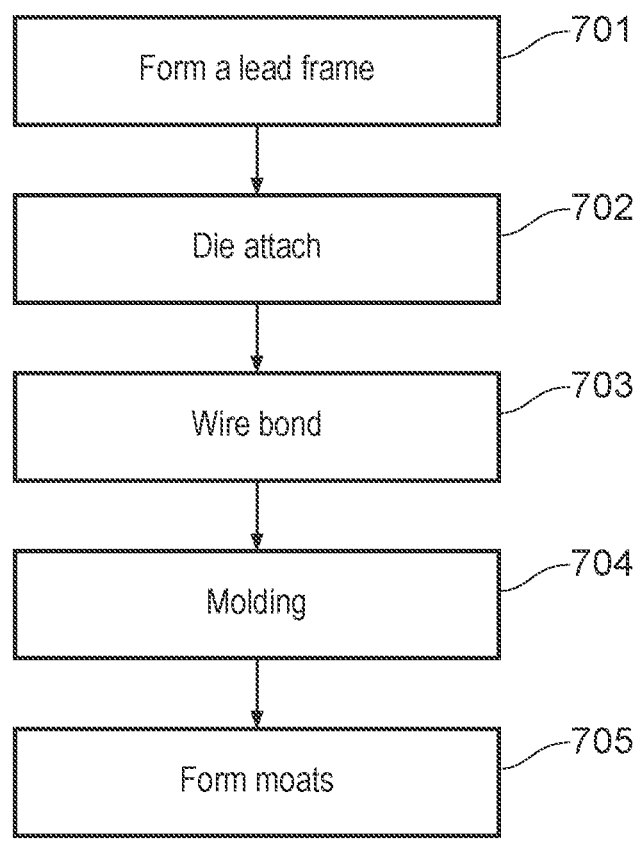
FIG. 7 is a flow chart shown the main method steps of forming the QFN package according to an embodiment of the present invention.

FIG. 7 is a flow chart showing the main method steps of forming the QFN package shown in FIG. 3A, FIG. 3B and FIG. 3C according to an embodiment of the present invention.

At step 701, a lead frame is formed made from a metal sheet, of copper, iron alloy, or the like, in belt or continuous Strip form, and is treated either by a sputtering or etching process, to produce the matrix arrangement of unit lead frames. The unit lead frames have the same configuration and may be arranged in a matrix form and supported by main tie bars and cross tie bars. The unit lead frames may interconnect with each other through cross tie bars.

Each of the unit lead frames has a thickness between a first surface and a second surface, and comprises a die pad having a substantially rectangular inner part and a plurality of protrusions around the periphery thereof and contiguous therewith and extending outwardly therefrom, a channel outward of each of the four sides of the die pad, and a plurality of leads around the four sides of the die-pad, and each side of the die pad spaced apart from a respective set of the lead by the channel. The protrusions may be formed together with the die pad and are part of the die pad. And the thickness of the protrusions and the die pad may be the same. The die pad further has a plurality of trenches having a depth which is smaller than the thickness of the lead frame extending from the second surface of the die pad towards the first surface at least in the inner part of the die pad using any appropriate processes for the trenches are required. Examples of the processes include, but are not limited to etching, milling, pressing or punching etc. Thus, each of the protrusions may block an end of one of the trenches to prevent the molding compound blocking the trenches during the following molding process. In the preferred embodiments, the trenches may also be provided to the second surface area of leads of the lead frame.

At step 702, a semiconductor die is attached to the first surface of the die pad by using any known die attach techniques.

At step 703, the semiconductor die may have electrodes on the active surface of the die and the electrodes may be eclectically connected to respective ones of the leads with bond wires.

At step 704, a molding operation is performed to encapsulate the semiconductor die with molding compound, but leave the distal ends of the leads exposed to allow external electrical communication with the die and leave the trenches exposed to the exterior. The molding compound fills spaces between the leads and is in spaces separating the die pad from the leads and defines the package.

At step 705, a cutting process with a saw-blade is performed to form a respective moat between each side of the die pad and a respective set of leads and to separated individual QFN packages from the matrix by cutting along the cross tie bars. Thus, the cross tie bars which connect between the unit lead frames are removed. In the preferred embodiment, the depth of the moats may be one fourth of the thickness of the die pad. The moat width may equal to a normal saw-blade width, that is to say, about 25 μm. After cutting, a plurality of the trenches each extend across a protrusion to the moat and unblocked-trenches may be provided at least on the second surface of the die pad.

In use, the package may be attached to a PCB or other substrate by using a soldering process. During the soldering process, supplementary solder layer may be formed on the second surface of the die pad and the leads. And the trenches may also be filled with soldering material. Commonly, the soldering process may create unwanted flux voids during reflow of the supplementary solder layer. The presence of protrusions, trenches and moats may help the unwanted flux voids formed during the solder process export to the exterior and then no void may be stay into solder.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the application as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A Quad Flat No-Lead (QFN) package comprising:
   a semiconductor die;
   a lead frame having a thickness between a first surface and a second surface, and comprising:
   a die pad having a substantially rectangular inner part and a plurality of protrusions around the periphery thereof and contiguous therewith and extending outwardly therefrom, and
   a plurality of leads around the four sides of the die-pad, spaced apart therefrom and electrically isolated therefrom, with spaces therebetween; and
   molding compound encapsulating the semiconductor die and forming the package, wherein the molding compound fills spaces between the leads and is in spaces separating the die pad from the leads, the molding compound having a respective moat of a plurality of moats therein between each side of the die pad and a respective set of leads;
   wherein the semiconductor die is attached to the first surface of the die pad;
   wherein the die pad has a plurality of trenches having a depth which is smaller than the thickness of the lead frame extending from the second surface of the die pad towards the first surface at least in the inner part of the die pad;

wherein each trench of the plurality of the trenches extends across a protrusion of the plurality of protrusions to a moat of the plurality of moats to be exposed from the moat.

2. The QFN package according to claim 1, wherein the protrusions of the plurality of protrusions are configured to have circular arc shapes.

3. The QFN package according to claim 1, wherein each of the protrusions of the plurality of protrusions are configured to be located between the closest points of the die pad to two respective adjacent leads.

4. The QFN package according to claim 1, each moat of the plurality of moats extends to an edge of the package.

5. The QFN package according to claim 1, wherein the depth of the moats of the plurality of moats is one fourth of the thickness of the lead frame.

6. The QFN package according to claim 1, wherein the depth of the trenches of the plurality of trenches is half of the thickness of the lead frame.

7. The QFN package according to claim 1, wherein the plurality of trenches form an interconnected network.

8. The QFN package according to claim 1, wherein each of the leads of the plurality of leads has a first end distal from the die pad and a second end proximal to the die pad, wherein the first end is configured to be coupled to an external circuit and the second end has a circular arc shape.

9. The QFN package according to claim 8, wherein the leads of the plurality of leads each has a trench which is configured to extend from the second surface towards the first surface and having a depth which is smaller than the thickness of the lead frame.

10. The QFN package according to claim 9, wherein the trench in each of the leads extends across the circular arc shape of the second end to a moat of the plurality of moats.

11. The QFN package according to claim 1, further comprising a solder layer of reflowable material formed on the second surface of lead frame and under the die pad and the leads of the plurality of leads.

12. An assembly comprising the QFN package according to claim 11, further comprising a printed circuit board (PCB) attached to a bottom surface of the solder layer.

13. A lead frame for use in the manufacture of a QFN package as claimed in claim 1, the lead frame having a thickness between a first surface and a second surface and comprising:

a die pad region having a first, rectangular, inner region with a plurality of protrusions around the periphery thereof and contiguous therewith and extending outwardly therefrom, a channel region outward of each of the four sides of the die pad region, and a plurality of lead regions around the die pad, and each side of the die pad region spaced apart from a respective set of the lead regions by the channel region;

wherein the lead frame further comprises a plurality of trenches having a depth which is smaller than the thickness of the lead frame extending from the second surface of the die pad region towards the first surface at least in the first inner region of the die pad region;

wherein a plurality of the trenches each extend only partially across a respective protrusion.

14. The QFN package according to claim 13, wherein the protrusions are configured to have circular arc shapes.

15. The QFN package according to claim 13, wherein each of the protrusions are configured to be located between the closest points of the die pad to two respective adjacent leads.

16. The QFN package according to claim 13, wherein each of the leads has a first end distal from the die pad and a second end proximal to the die pad, wherein the first end is configured to be coupled to an external circuit and the second end has a circular arc shape.

17. The QFN package according to claim 16, wherein the leads each has a trench which is configured to extend from the second surface towards the first surface and having a depth which is smaller than the thickness of the lead frame.

18. A semiconductor package comprising, a semiconductor die;

a lead frame having a thickness between a first surface and a second surface, and comprising:

a die pad having a generally rectangular inner part and a plurality of protrusions around the periphery thereof and contiguous therewith and extending outwardly therefrom, and molding compound encapsulating the semiconductor die and forming the package, wherein the molding compound having a moat structure around each side of the die pad;

wherein the semiconductor die is attached to the first surface of the die pad;

wherein the die pad has a plurality of trenches having a depth which is smaller than the thickness of the lead frame extending from the second surface of the die pad towards the first surface at least in the inner part of the die pad;

wherein each trench of the plurality of the trenches extends across a protrusion of the plurality of protrusions to the moat structure to be exposed from the moat structure.

19. The QFN package according to claim 18, wherein the protrusions of the plurality of protrusions are configured to have circular arc shapes.

20. The semiconductor package according to claim 18, wherein the plurality of trenches form an interconnected network.

* * * * *